(12) United States Patent
Santi

(10) Patent No.: US 9,648,772 B2
(45) Date of Patent: May 9, 2017

(54) CONTROL PERIPHERAL POST OF RAILWAY FIELD DEVICES PROVIDED WITH MEANS TO FACILITATE THE EXTRACTION OF THE CONTROL MODULES

(71) Applicant: ECM S.p.A., Serravalle Pistoiese (IT)

(72) Inventor: Alessandro Santi, Serravalle Pistoiese (IT)

(73) Assignee: ECM S.P.A., Serravalle Pistoiese (IT)

( * ) Notice: Subject to any disclaimer, the term of this patent is extended or adjusted under 35 U.S.C. 154(b) by 0 days.

(21) Appl. No.: 15/026,758

(22) PCT Filed: Oct. 3, 2014

(86) PCT No.: PCT/IT2014/000260
§ 371 (c)(1),
(2) Date: Apr. 1, 2016

(87) PCT Pub. No.: WO2015/049709
PCT Pub. Date: Apr. 9, 2015

(65) Prior Publication Data
US 2016/0234956 A1    Aug. 11, 2016

(30) Foreign Application Priority Data

Oct. 4, 2013 (IT) .............................. RM2013A0543

(51) Int. Cl.
*H05K 7/14* (2006.01)
*B61L 27/00* (2006.01)

(52) U.S. Cl.
CPC ............ *H05K 7/1408* (2013.01); *B61L 27/00* (2013.01); *H05K 7/1424* (2013.01); *H05K 7/1474* (2013.01)

(58) Field of Classification Search
CPC .. H05K 7/1408; H05K 7/1424; H05K 7/1474; H05K 7/1411; H05K 7/1409;
(Continued)

(56) References Cited

U.S. PATENT DOCUMENTS 3,926,490 A * 12/1975 Bertellotti ............ H05K 7/1408
312/9.53
4,418,820 A * 12/1983 Nagle .................. H05K 7/1424
206/451
(Continued)

FOREIGN PATENT DOCUMENTS

| DE | 2615671 A1 | 10/1977 |
| DE | 2615682 A1 | 10/1977 |
| DE | 2757761 A1 | 6/1979 |

*Primary Examiner* — Courtney Smith
*Assistant Examiner* — Christopher L Augustin
(74) *Attorney, Agent, or Firm* — Arent Fox LLP; Michael Fainberg

(57) ABSTRACT

There is described a control peripheral post of railway field devices, comprising: —at least one row of control modules operatively connected or connectable by electric cables to field devices; —a support frame having a front side and housing said row of control modules; wherein said support frame comprises at least one anti-extraction bar positioned on the front side of the support frame, said bar being adapted to selectively take an extraction configuration, wherein said bar is positioned in such a way as to permit the extraction of the control modules from the front side of the support frame, and a blocking configuration, wherein said bar is positioned in front of said row of control modules so as to prevent the extraction of the control modules (4, 5) of said row from the front side of the support frame.

8 Claims, 7 Drawing Sheets

(58) Field of Classification Search
CPC ...... H05K 7/1431; H05K 7/1489; H05K 7/18; B61L 27/00
See application file for complete search history.

(56) References Cited

U.S. PATENT DOCUMENTS

| | | | | |
|---|---|---|---|---|
| 4,620,756 A * | 11/1986 | Gatti | ...................... | H05K 7/1408 29/758 |
| 4,964,810 A | 10/1990 | Malotke et al. | | |
| 5,128,833 A * | 7/1992 | Lin | ...................... | H05K 7/1408 211/41.17 |
| 5,735,407 A * | 4/1998 | Kallio | ................. | H05K 13/0069 206/707 |
| 6,049,451 A | 4/2000 | Schmitt et al. | | |
| 6,312,919 B1 * | 11/2001 | Saitoh | .................. | C12N 9/0006 426/56 |
| 2002/0060197 A1 * | 5/2002 | Tabuchi | ............... | H05K 7/1409 211/41.17 |
| 2003/0233855 A1 | 12/2003 | Prveysian | | |
| 2005/0174743 A1 * | 8/2005 | Downing | ............... | H05K 5/023 361/725 |
| 2007/0090268 A1 * | 4/2007 | Sun | ...................... | H05K 7/1408 248/560 |
| 2011/0017894 A1 * | 1/2011 | Yu | ........................ | H05K 7/1489 248/309.1 |
| 2012/0134088 A1 * | 5/2012 | Li | ........................ | H05K 7/1408 361/679.4 |

* cited by examiner

CONTROL PERIPHERAL POST OF RAILWAY FIELD DEVICES PROVIDED WITH MEANS TO FACILITATE THE EXTRACTION OF THE CONTROL MODULES The present description relates to the technical field of control systems of a railway line and more particularly it relates to a control peripheral post of railway field devices.

Railway interlocking and/or signalling systems are known, comprising a central control post and one or more peripheral posts operatively connected to the central post. The control peripheral posts are operatively connected, for example by means of electrical cables, to a plurality of railway field devices, such as signalling devices, level crossings, switches, turnouts, track circuits, etc. In particular, control modules are provided in the control peripheral post, each connected to one or more respective field devices. Said control modules are normally housed in dedicated racks. The system architecture is often modular, meaning that each rack can accommodate a plurality of control modules that can be removed or added independently of each other, on the basis of the needs related to the number of field devices to be controlled and based on needs related to maintenance and/or scaling of the system.

In this regard, a drawback of the control peripheral post of the prior art results from the fact that the extraction/insertion of the control modules from the respective seats provided in the rack is relatively difficult and requires the use of tools which may be lost or which may otherwise not always be at hand. In fact, typically each control module is retained in the respective seat provided in the rack by means of a plurality of screws which must be unscrewed/screwed to extract/insert a single module in the rack. This requires relatively long times, particularly when it is necessary to extract and/or insert a plurality of control modules in the rack.

A general object of the present description is to provide a control peripheral post of railway field devices which is capable of solving or at least partly minimising the drawbacks mentioned above with reference to the prior art.

This and other objects are achieved by a control peripheral post of railway field devices as defined in claim 1 in the most general form thereof and in the dependent claims in some particular embodiments thereof.

An object of the present invention is also a railway signalling and/or interlocking system as defined in claim 10.

The invention will be better understood from the following detailed description of embodiments thereof, made by way of an example and therefore in no way limiting with reference to the accompanying drawings, in which.

Figure 1:
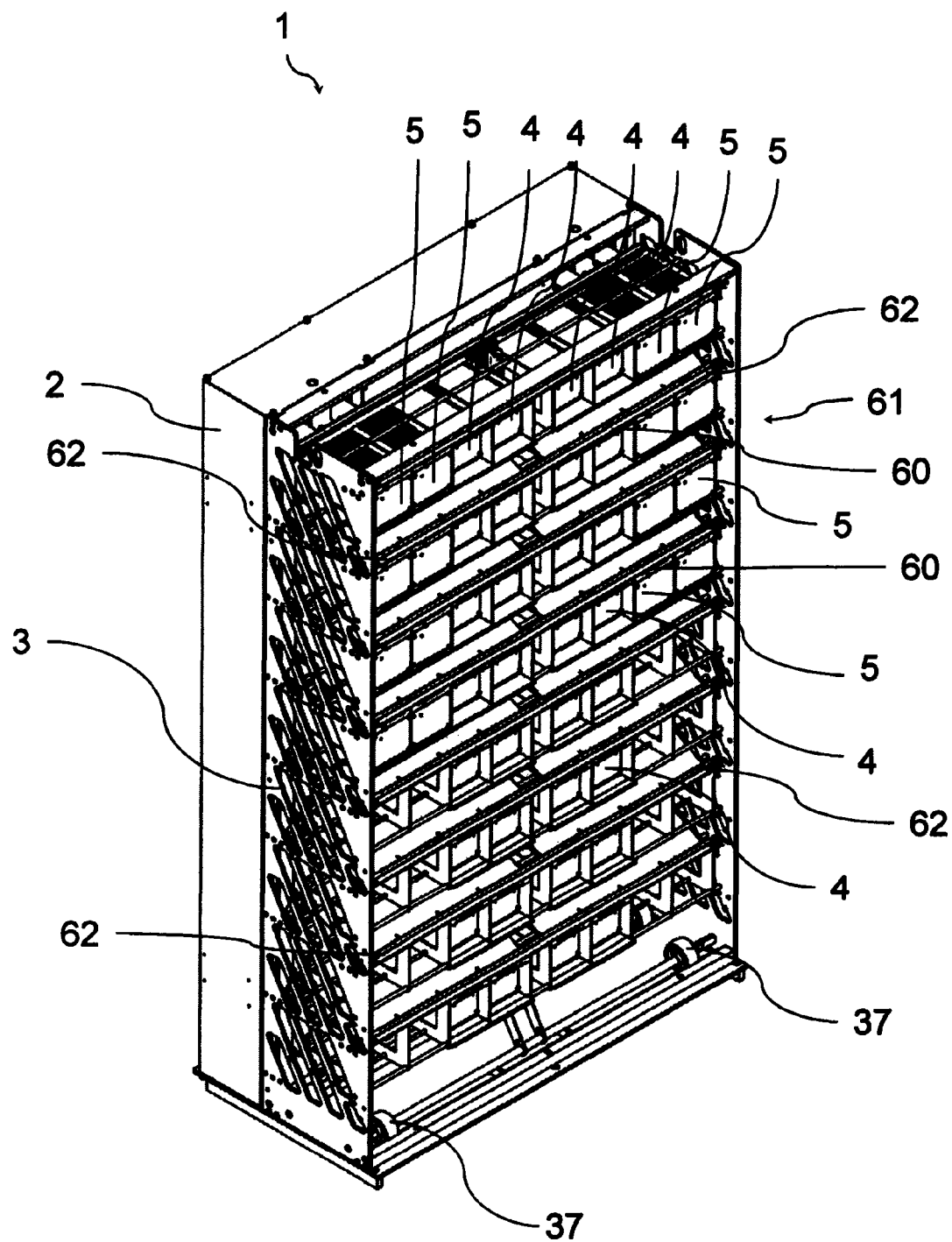
FIG. 1 shows a perspective view from the front side of a control peripheral post comprising a rack housing a plurality of control modules of railway field devices, wherein the rack includes a wiring frame and a support frame.

In general, in the accompanying figures, elements which are equivalent or similar will be indicated by the same reference numerals. However, in some cases, explicitly indicated in the following description, for greater clarity of description some equivalent or similar elements may also be indicated with different reference numerals.

It is also noted that the terms "upper", "lower", "vertical" and "horizontal" which will be used in the following description to describe a control peripheral post or a part thereof, will be understood as referring to a control peripheral post installed in a normal operating condition.

FIG. 1 shows a control peripheral post 1 including a rack 2, 3 housing a plurality of control modules 4, 5 of railway field devices. Based on the number of field devices to be controlled, it is clear that the control peripheral post 1 may include more racks 2, 3 of the type shown in FIG. 1. The control peripheral post 1 in FIG. 1 is for example comprised within a railway signalling and/or interlocking system comprising a central post (not shown) and a plurality of control peripheral posts 1, wherein the central post is operatively connected to the peripheral posts 1 and the peripheral posts 1 are operatively connected to the field devices. The central post is such as to send the railway logic control signals to the control peripheral posts 1 and is such as to receive signals from the control peripheral posts containing information about the status of the field devices controlled. The central post is connected to the control peripheral posts 1 by a suitable telecommunications network, such as optical fibre, for example based on an Ethernet protocol.

The railway signalling and/or interlocking system is intended to control one or more railway lines, where for the purposes of this description, "railway line" means any line, comprising one or more tracks, either underground or surface or mixed, either urban and suburban, including a metro line.

The control modules 4, 5 are operationally connected or connectable, e.g. by means of electrical cables (not shown), to a plurality of railway field devices (not shown in the figures), such as: signalling devices, level crossings, switches, turnouts, track circuits, etc. to send to said devices control and/or supply signals and preferably to receive incoming status signals from the controlled devices.

Figure 2:
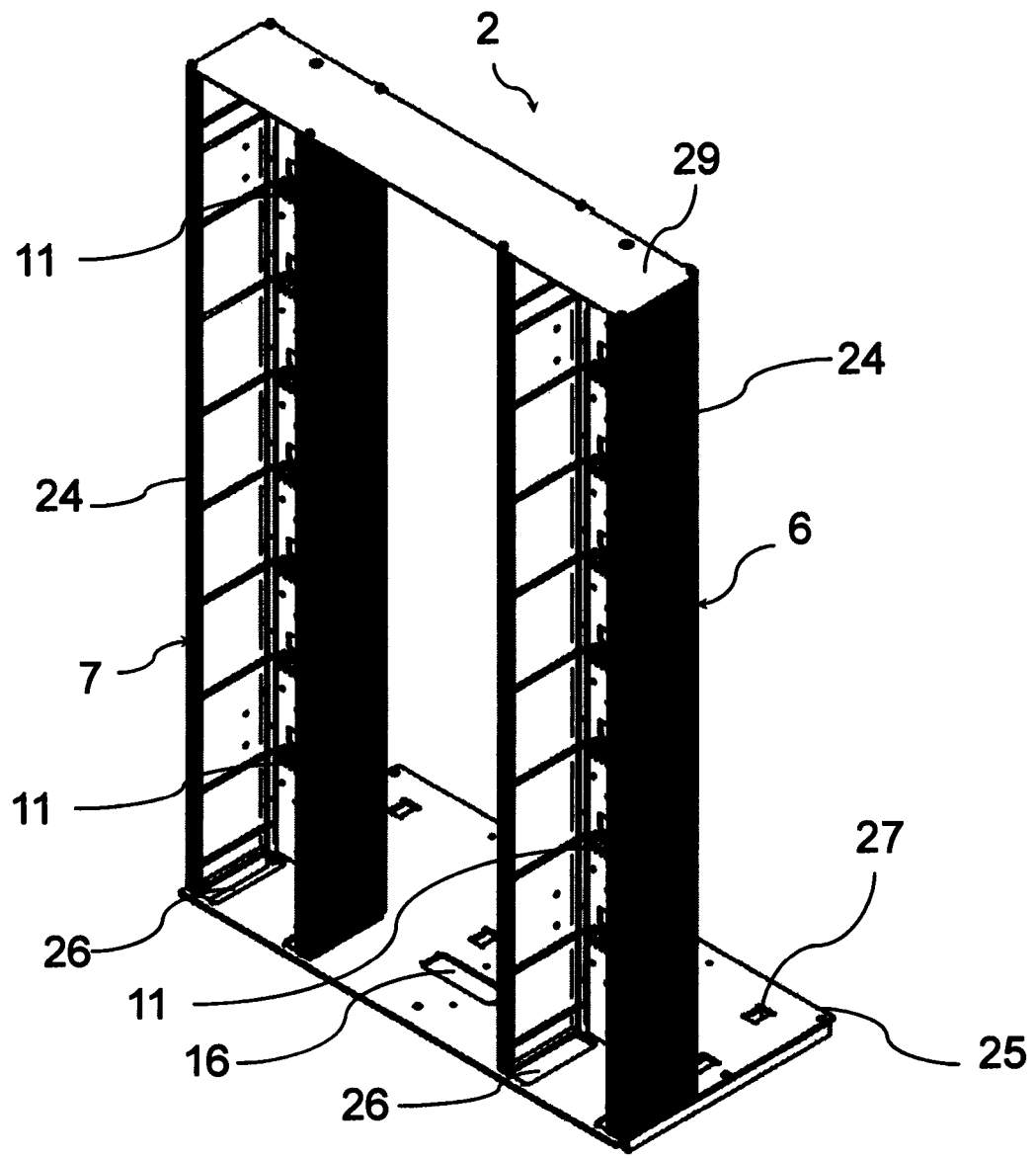
FIG. 2 shows a perspective view from the rear side of the wiring frame in FIG. 1.

According to a preferred embodiment, rack 2, 3 comprises a wiring frame 2 and a support frame 3. The wiring frame 2 (FIG. 2) is adapted to be stably attached to a support surface or an installation wall. Such a frame 2 comprises a front side 6 and an opposite rear side 7 and on the rear side 7 it comprises first connectors 11 adapted to be electrically connected to terminal portions of said electrical cables.

With reference again to FIG. 1, the support frame 3 of the control modules 4, 5 is adapted to accommodate and support said modules 4, 5 and is couplable to the wiring frame 2 by drawing the support frame 3 near the wiring frame 2 until reaching a coupling position.

With reference again to FIGS. 2 and 3, according to a preferred embodiment, the wiring frame 2 comprises at least one upright 24 and a base 25 to which upright 24 is attached and which projects in relation to said upright from the front side 6 of the wiring frame 2. According to an embodiment, said upright 24 has a cross section generally "U" or "C" shaped. Preferably, said base 25 is plate-shaped and allows the attachment of the wiring frame 2 to a floating floor. In the particular example shown, the wiring frame 2 is provided with two uprights 24 connected at the top by a plate-shaped crosspiece 24.

In the coupling position between the wiring frame and the support frame 3, the support frame 3 is superposed on base 25. Preferably, base 25 comprises stop elements 27 adapted to stabilise said coupling position. For example, according to an embodiment, the support frame 3 of the control modules 4, 5 is provided underneath with a plurality of wheels 37, for example four wheels 37, preferably made of Teflon. In such an embodiment, said stop elements 27 of base 25 include recesses 27 adapted to receive at least partially said wheels 37, so that drawing the support frame 3 near the wiring frame 2, said wheels superpose to base 25 and it is possible to draw the two frames 4, 5 near each other until wheels 37 enter into the respective recesses 27.

According to an embodiment, base 25 is provided with one or more through openings 26 provided for the passage of the connection cables to the railway field devices.

Figure 3:
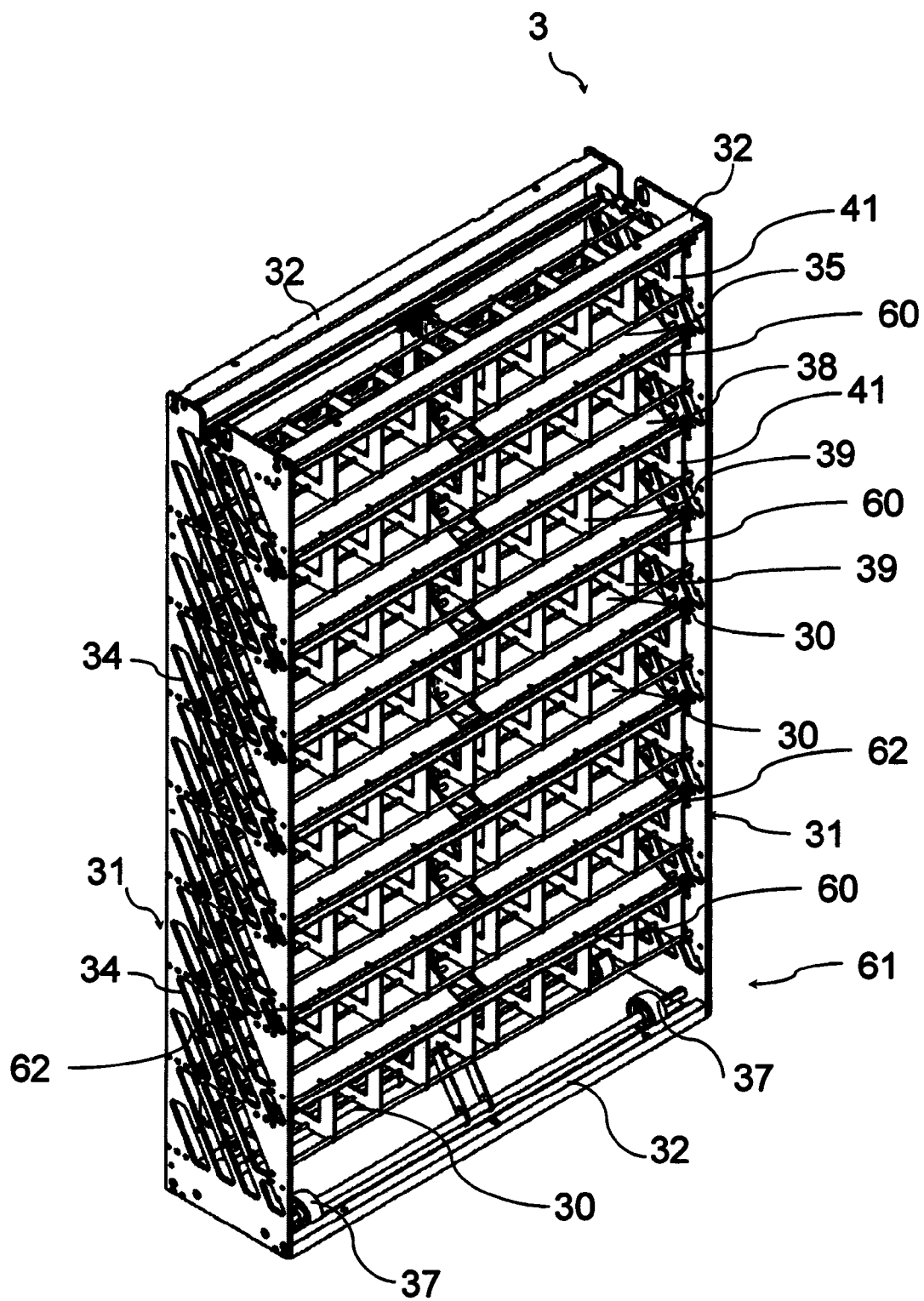
FIG. 3 shows a perspective view from the front side of the support frame in FIG. 1.

With reference to FIG. 3, according to a preferred embodiment, the support frame 3 comprises a plurality of seats 30 wherein the control modules 4, 5 are or may be fitted. Preferably, said seats 30 form an array of seats arranged over multiple rows, such as eight rows as in the case of the support frame 3 shown in the accompanying figures.

Figure 6:
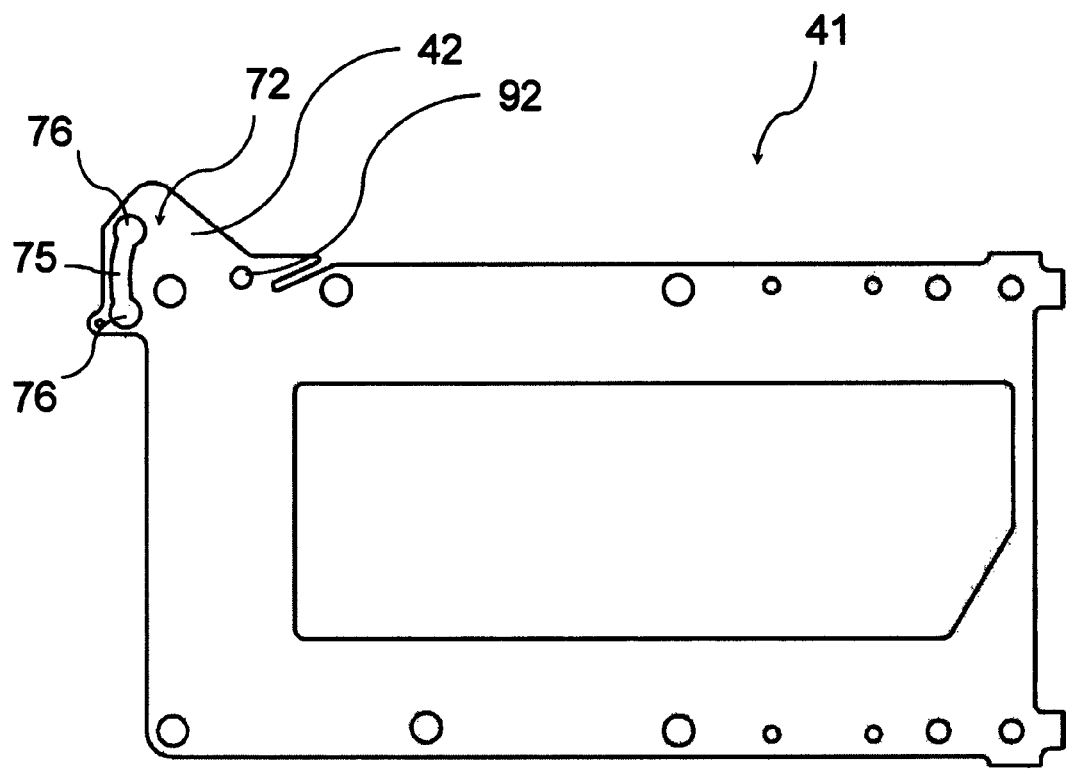
FIG. 6 shows a lateral plan view similar to the FIGS. 4 and 5 wherein the anti-extraction bar and some further elements shown in such figures have been removed.

Preferably, the support frame 3 comprises a pair of lateral uprights 31, preferably comprising two lateral vertical plates 31, which are held together by at least one cross member 32, and more preferably by a plurality of cross members 32. Preferably, the vertical plates 31 have a plurality of openings 34 and are preferably made of metal, for example aluminium. Preferably, a plurality of rods 35 extend between the vertical plates 31 for each row of seats 30, which vertically delimit seats 30 and on which the control modules 4, 5 rest. Preferably, in order to horizontally delimit seats 30, a plurality of vertical delimiting plates 39, 41 is provided which are preferably crossed by rods 35. According to a preferred embodiment, for each row of seats 30, the delimiting plates 39, 41 comprise a plurality of plates 39 of a first type, or intermediate plates 39, and a pair of plates 41 of a second type, or end plates 41, between which the intermediate plates 39 are interposed. FIG. 6 shows a currently preferred embodiment of one of plates 41 of the second type, the structure of which will be discussed in more detail hereafter. Preferably, between two consecutive rows of seats 30, the support frame 3 comprises at least one inclined panel 38, for example metal, which serves for conveying towards the rear face of the support frame 3 the heat produced in operation by the control modules 4, 5.

Figure 8:
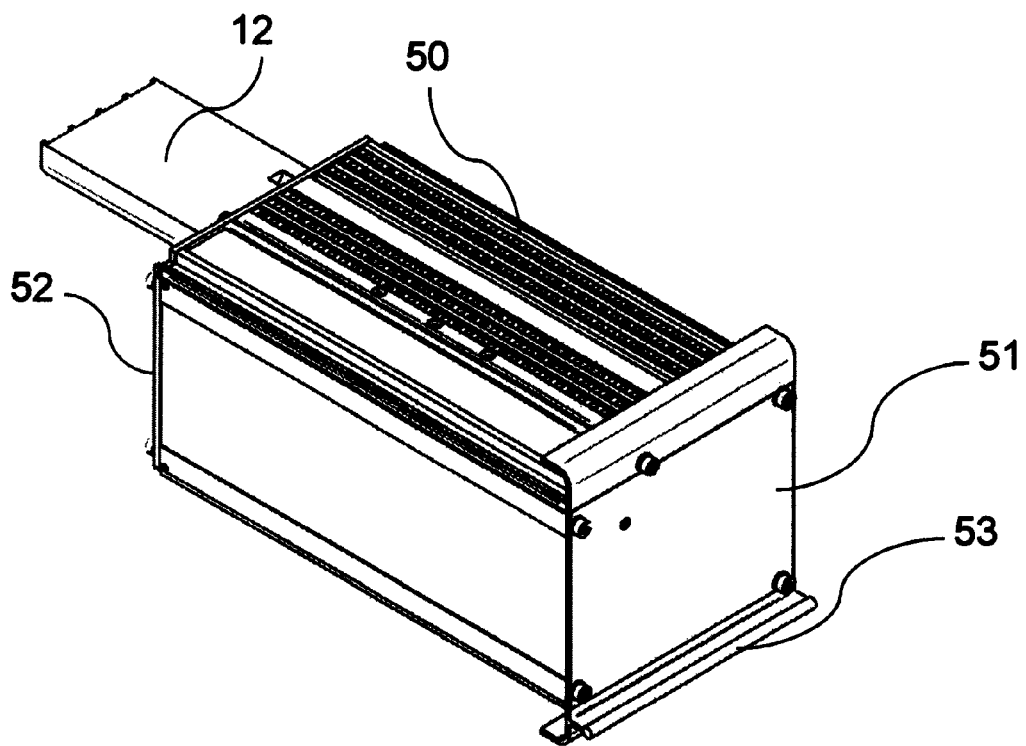
FIG. 8 shows a perspective view from the front side of a control module.

The control modules 4, 5, one of which is shown in FIG. 8, comprise second connectors 12 which in said coupling position of the frames 2, 3 are electrically interconnected, or are adapted to be electrically interconnected, to corresponding first connectors 11 of the wiring frame 2.

With reference again to FIG. 8, preferably the control modules 4, 5 comprise a container body 50, comprising a front face 51 and a rear face 52. According to a preferred embodiment, the control modules 4, 5 comprise a gripping handle 53 which preferably protrudes from the front face 51. The container body 50 accommodates one or more circuit boards therein, for example input boards, output boards and processing boards. Such circuit boards may be intended both for signal processing and for conditioning such signals, for example in order to provide output signals of suitable power for the control and/or the supply of the railway field devices. To this end, it is possible to provide processing modules 4 intended for signal processing and separate signal conditioning modules 5, each operatively interconnected to a respective processing module 4. The processing modules 4 are operatively interconnected to the central post and are such as to control the conditioning modules 5 so that they in turn control the railway field devices. Each pair consisting of a processing module 4 and of a respective conditioning module 5 represents a railway field device controller.

If there is a distinction of the type described above between the processing modules 4 and the conditioning modules 5, it is clear that it will be necessary to implement only the wiring of the conditioning modules 5 to the railway field devices. In this case, moreover, the processing modules 4 may be connected to the respective conditioning module 5 via a bus circuit board (not shown in the figures) placed at the bottom of seats 30, in the support frame 3. To this end, both the processing modules 4 and the conditioning modules 5 preferably comprise an interface connector (not shown in the figures) provided to implement the connection of modules 4, 5 to the board-bus.

Returning to FIG. 1, according to a preferred embodiment, the support frame 3 comprises at least one row of control modules 4, 5 which comprises a plurality of control modules operatively connected or connectable to field devices. More preferably, the support frame 3 comprises a plurality of rows of control modules 4, 5, which are preferably in vertical columns. In other words, the support frame 3 preferably comprises a plurality of rows of control modules 4, 5 each of which comprises a plurality of control modules that are horizontally aligned or substantially aligned with each other. In the example shown in FIG. 1, each row of seats 30 of the support frame 3 is adapted to accommodate a row of control modules 4, 5 comprising eight control modules 4, 5. In particular, in the example shown in FIG. 1, the processing modules 4 occupy the four central seats in a row and the conditioning modules 5 the remaining four lateral seats. Advantageously, the support frame 3 comprises at least one anti-extraction bar 60, or blocking bar 60, arranged on the front side 61 of the support frame 3. In the example, the front side 61 of the support frame 3 is the side of such a frame which is associated with the front faces 51 of control modules 4, accommodated in the support frame. According to a preferred embodiment, the support frame 3 comprises a plurality of anti-extraction bars 60, in the example eight anti-extraction bars 60, which are each associated to a respective row of control modules 4, 5, or to a respective row of seats 30, in the latter case referring to frame 3 without the control modules accommodated in seats 30. Each anti-extraction bar 60 is adapted to selectively take an extraction configuration (FIG. 4) and a blocking configuration (FIG. 5). In the extraction configuration, bar 60 is positioned in such a way as to permit the extraction of the control modules of the respective row from the front side 61 of frame 3. In the blocking configuration, bar 60 is arranged frontally to the plurality of control modules 4, 5 of the respective row of control modules to prevent the extraction of the control modules of such a row from the front side 61 of the support frame.

According to a preferred embodiment, each anti-extraction bar 60 is a horizontal bar selectively movable between an upper extraction position (FIG. 4) and a lower blocking position (FIG. 5) which correspond to the above extraction and blocking configurations, respectively.

Figure 4:
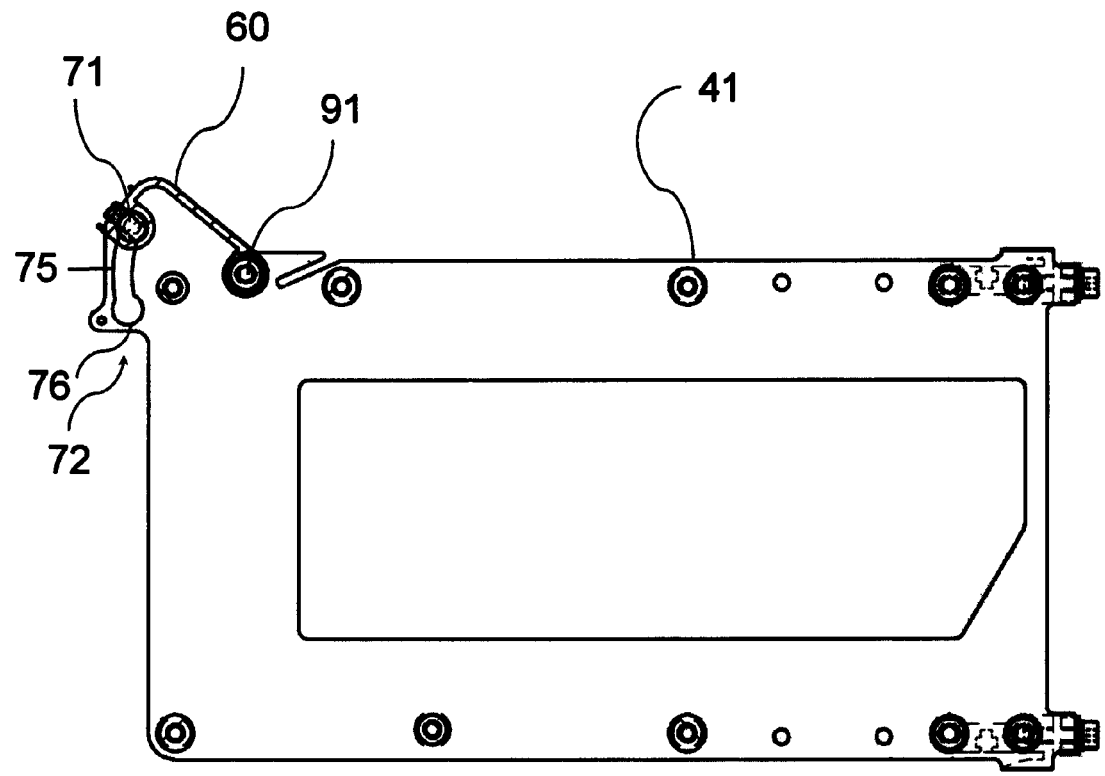
FIG. 4 shows a lateral plan view of a part of the support frame in FIG. 1 where, in particular, there is shown a sectional view of an anti-extraction bar in a respective first configuration.
Figure 5:
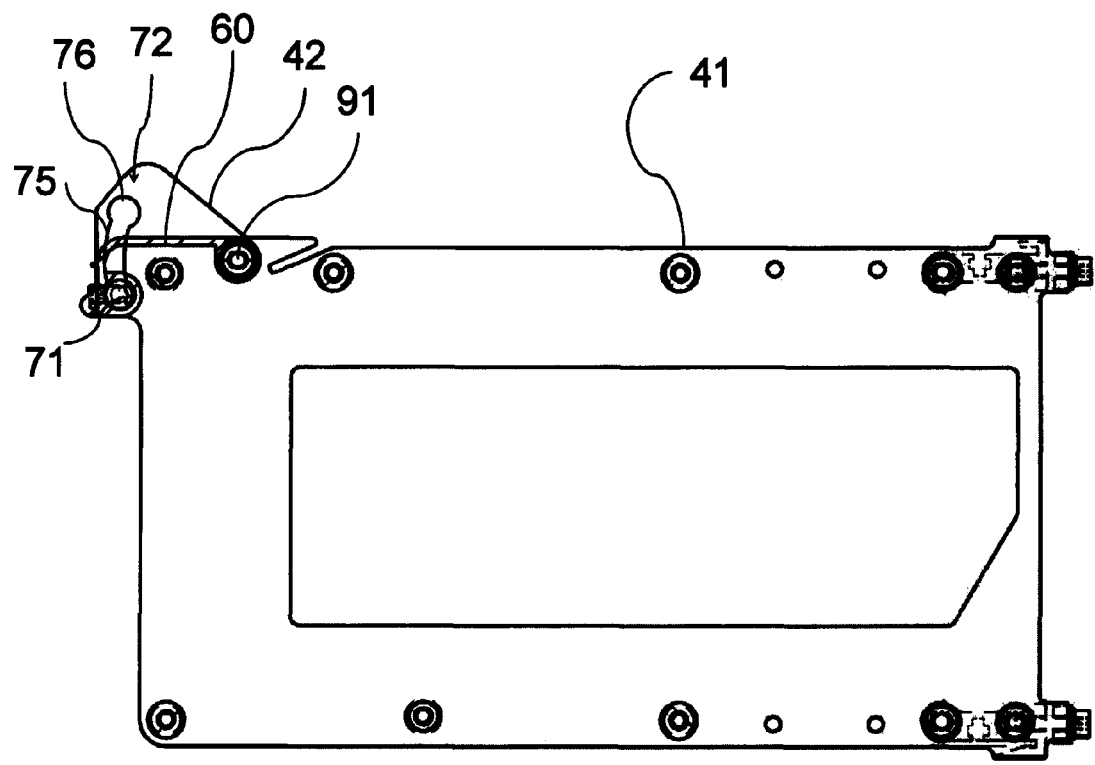
FIG. 5 shows a lateral plan view of the same elements shown in FIG. 4 but where the anti-extraction bar is shown in a respective second configuration.
Figure 7:
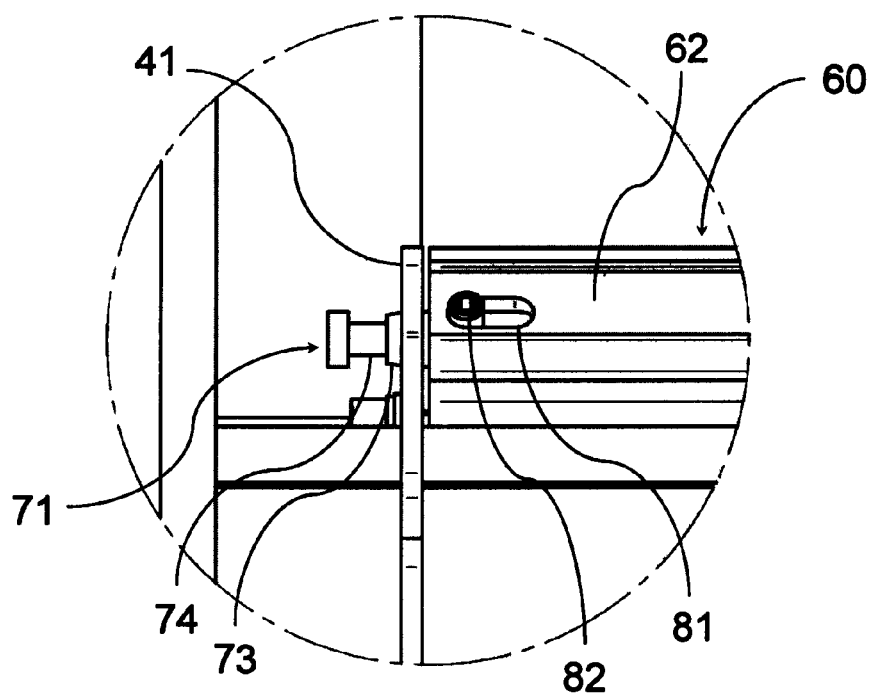
FIG. 7 shows a front plan view of an enlarged detail of the support frame in FIG. 1 where there is partly shown the anti-extraction bar shown in FIGS. 4 and 5.

With reference to FIGS. 4-6, according to a preferred embodiment, the support frame 3 comprises blocking elements 71, 72 provided to selectively block each bar 60 in the extraction and blocking configurations. Preferably, such blocking elements 71, 72 are associated with the two opposite end portions 62 (FIGS. 1 and 3) of each bar 60. However, according to a less preferred alternative embodiment, as it would allow a less effective blocking of bar 60, the blocking elements 71, 72 may also be associated to only one of the end portions 62 of bar 60. With reference to FIG. 7, according to a preferred embodiment, each bar 60 has a pair of blocking pins 71 with variable thickness (FIG. 7 only shows one of the blocking pins 71 while the other pin 71 associated with the opposite end portion of bar 60 is not shown since such a bar is partially shown in FIG. 7). The blocking pins 71 are slidably mounted each to a respective end portion 62 of the anti-extraction bar. With reference to FIGS. 6 and 7, each blocking pin comprises in particular a portion of pin 73 with relatively greater cross-section and a portion of pin 74 with relatively lesser cross-section. According to a preferred embodiment, the portion with lesser cross-section 74 of the blocking pin is adapted to co-operate with a central sliding portion 75 of a respective blocking slot 72 which is preferably provided on one of said end plates 41, and more preferably on a protruding portion 42 (FIG. 6) of such a plate 41. In particular, the portion with lesser cross-section 74 is adapted to co-operate with the central sliding portion 75 of the blocking slot to allow the sliding of the blocking pin during a shift of the anti-extraction bar 60. The portion with greater cross-section 73 of the blocking pin is adapted instead to co-operate with a pair of end portions 76 of the blocking slot 72 which are relatively widened in relation to the sliding portion 75. More in particular, the portion with greater cross-section 73 is adapted to co-operate with the widened end portions 76 of the blocking slot to block the anti-extraction bar 60 in said extraction and blocking configurations.

With reference again to FIG. 7, according to a preferred embodiment, each anti-extraction bar 60 has a pair of end stop slots 81 each of which is associated to a respective blocking pin 71 (only one end stop slot 81 is shown in FIG. 7). Moreover, each blocking pin 71 is preferably provided with an end stop element 82 projecting from the blocking pin which crosses the end stop slot 81. Each end stop slot 81 and the relative projecting end stop element 82 are adapted to co-operate with each other to define two opposite end stop positions of the respective blocking pin 71. According to an advantageous embodiment, the projecting end stop element 82 is detachably joined to the respective blocking pin 71. For example, the end stop element 82 may be screwed to the blocking pin 71 by means of a tool, such as for example an Allen wrench. The devise of detachably joining the end stop element 82 to the blocking pin 71 advantageously allows inserting/removing the blocking pin 71 from the respective sliding seat provided in bar 60, making the assembly/disassembly of bar 60 particularly easy, for example during assembly/disassembly operations of the support frame 3.

It is noted that each bar 60 is hinged-mounted, for example via a pair of hinge pins 91 (FIGS. 4 and 5) which project laterally from bar 60 and which are coupled to respective hinge holes 92 (FIG. 6) provided on said end plates 41. In other words, as can be seen for example from FIG. 4 and FIG. 5, each anti-extraction bar 60 is mounted pivotally hinged so as to be able to rotate about a fixed and predetermined axis of rotation. With reference again to FIG. 4 and FIG. 5, according to a preferred embodiment, the fixed and predetermined axis of rotation of each anti-extraction bar 60 is a horizontal axis.

Having described the structure of the peripheral post 1, a method of extraction of the control modules 4, 5 from a row of seats 30 of the support frame 3 will now be described by way of example with reference to the embodiment shown in the accompanying figures.

Let's assume that the anti-extraction bar 60 associated with a row of seats 30 initially is in the blocking configuration (FIG. 5). In this configuration, bar 60 takes the lower blocking position and the two blocking pins 71 of bar 60 are relatively more protruding laterally in such a way that the respective portions with greater cross-section 73 engage respective widened portions 76 of the blocking slots 72 so as to keep bar 60 blocked. In particular, in this configuration the blocking pins 71 take one of the end stop positions defined by the end stop slots 81 and by the respective protruding end stop elements 82. Starting from this configuration, to make bar 60 take the upper extraction position, it is sufficient to press, for example manually, the blocking pins 71 so as to disengage such pins from the widened end portions 76 of slots 72 and bring them to the other end stop position defined by the end stop slots 81 and by the protruding end stop elements 82. In this configuration, the blocking pins 71 are relatively less protruding laterally with respect to the case of the blocking configuration. At this point, bar 60 may be moved, for example manually, by sliding the portions with lesser cross-section 74 of the blocking pins through the central sliding portions 75 of the blocking slots 75 until the anti-extraction bar takes the upper extraction position. Once bar 60 has taken the upper extraction position, it is possible to block bar 60 making the blocking pins 71 take again the end stop position they had in the blocking configuration. In other words, starting from the upper extraction position, it is possible to block bar 60 by pulling the blocking pins until the portion with greater cross-section 73 of the blocking pins 71 engages in the other widened end portion 76 of the blocking slots 72. In this way, bar 60 takes the extraction configuration (FIG. 4). In this configuration, one or more control modules 4, 5 can be extracted (or inserted) relatively easily from/into the respective seats 30, preferably by means of the respective gripping handles 53.

The control peripheral post 1 described above advantageously allows inserting/removing a plurality of control modules in a considerably easier and faster manner compared to the prior art solutions discussed above by simply making the anti-extraction bars take the respective extraction configuration without the need to unscrew/screw a plurality of fixing screws to retain the control modules in the respective seats provided in the support frame.

According to what described above, it is therefore possible to understand how a control peripheral post of the type described above allows achieving the objects mentioned above with reference to the prior art.

The principle of the invention being understood, the manufacturing details and the embodiments may widely vary compared to what described and illustrated by way of a non-limiting example only, without departing from the scope of the invention as defined in the accompanying claims.

The invention claimed is:

1. Control peripheral post of railway field devices, comprising:

at least one row of control modules comprising a plurality of control modules operatively connected or connectable by electric cables to field devices;

a support frame having a front side and housing said row of control modules;

wherein said support frame comprises at least one anti-extraction bar positioned on the front side of the support frame, said bar being adapted to selectively take an extraction configuration, wherein said bar is positioned in such a way as to permit the extraction of the control modules of said row from the front side of the support frame, and a blocking configuration, wherein said bar is positioned in front of said row of control modules so as to prevent the extraction of the control modules of said row from the front side of the support frame;

the anti-extraction bar being mounted pivotally hinged so as to be able to rotate about a fixed and predetermined axis of rotation;

wherein the support frame comprises blocking elements provided for selectively blocking said anti-extraction bar in the extraction and blocking configurations;

wherein said anti-extraction bar comprises two opposite end portions and wherein said blocking elements are associated to at least one of said two opposite end portions;

wherein said blocking elements comprise a blocking slot and a blocking pin of variable thickness which is slidably mounted to one of said opposite end portions of said anti-extraction bar, the blocking in comprising a portion of pin with a relatively greater cross-section and a portion of pin with a relatively lesser cross-section, the blocking slot comprising a central sliding portion and a pair of end portions widened in relation to the central sliding portion, wherein the central sliding portion is adapted to co-operate with said portion of a lesser cross-section of the blocking in to permit the sliding of said pin during a shift of said anti-extraction bar and wherein said widened end portions are adapted to cooperate with said portion of a greater cross-section of the blocking pin to block the anti-extraction bar in said extraction and blocking configurations.

2. Control peripheral post according to claim 1, wherein said axis of rotation is a horizontal axis.

3. Control peripheral post according to claim 1, wherein the support frame comprises at least one row of seats wherein the control modules of said row are accommodated, in said frame there being provided a plurality of vertical delimiting plates for horizontally delimiting the seats of said row, said plurality of vertical delimiting plates comprising a plurality of plates of a first type and a pair of plates of a second type between which there are interposed the plates of the first type, said anti-extraction bar being hinge-mounted by means of a pair of hinge pins which laterally protrude from the bar and which are coupled to respective hinge holes provided on said plates of the second type.

4. Control peripheral post according to any of the previous claims, wherein said anti-extraction bar is a horizontal bar selectively movable between an upper extraction position and a lower blocking position corresponding to said extraction and blocking positions, respectively.

5. Control peripheral post according to claim 1, wherein the support frame comprises an end stop slot provided on the anti-extraction bar and an end stop element projecting from the blocking pin which crosses the end stop slot, the end stop slot and the end stop element being adapted to cooperate with each other to define two opposite end stop positions of the blocking pin.

6. Control peripheral post according to claim 5, wherein said projecting end stop element is detachably joined to the blocking pin.

7. Control peripheral post according to claim 1, comprising a plurality of said rows of control modules in vertical column, the support frame comprising a plurality of said anti-extraction bars which are each associated to a respective row of control modules.

8. Railway interlocking and/or signalling system comprising a central control post and a plurality of control peripheral posts according to claim 1 connected to said central post.

* * * * *